US006286126B1

United States Patent
Raghavan et al.

(10) Patent No.: US 6,286,126 B1
(45) Date of Patent: Sep. 4, 2001

(54) METHODS, APPARATUS AND COMPUTER PROGRAM PRODUCTS FOR PERFORMING POST-LAYOUT VERIFICATION OF MICROELECTRONIC CIRCUITS USING BEST AND WORST CASE DELAY MODELS FOR NETS THEREIN

(75) Inventors: Vivek Raghavan, Mountain View; Brian A. Zimmerman, San Jose, both of CA (US)

(73) Assignee: Avant! Corporation, Fremont, CA (US)

( * ) Notice: Subject to any disclaimer, the term of this patent is extended or adjusted under 35 U.S.C. 154(b) by 0 days.

(21) Appl. No.: 09/292,783

(22) Filed: Apr. 13, 1999

Related U.S. Application Data (63) Continuation-in-part of application No. 08/706,182, filed on Aug. 30, 1996, now Pat. No. 5,896,300.

(51) Int. Cl.[7] .................................................... G06F 17/50
(52) U.S. Cl. .................................................................. 716/6
(58) Field of Search .......................................... 716/1–21

(56) References Cited

U.S. PATENT DOCUMENTS

| 5,095,454 | 3/1992 | Huang | 703/19 |
|---|---|---|---|
| 5,281,558 | 1/1994 | Bamji et al. | 716/2 |
| 5,349,659 | 9/1994 | Do et al. | 707/7 |
| 5,455,928 | 10/1995 | Herlitz | 703/13 |
| 5,461,576 | 10/1995 | Tsay et al. | 716/6 |
| 5,467,291 | * 11/1995 | Fan et al. | 703/14 |
| 5,469,366 | 11/1995 | Yang et al. | 716/6 |
| 5,475,605 | 12/1995 | Lin | 716/6 |
| 5,490,095 | 2/1996 | Shimada et al. | 703/14 |

(List continued on next page.)

OTHER PUBLICATIONS

Borah et al., "Recent developments in performance driven Steiner routing: an overview", Proceedings of Sixth Great Lakes Symposium on VLSI, 1996, pp. 137–142, Mar. 1996.*

Goel et al., "MOdeling of crosstalk and propagation delays in the crossing interconnections on GaAs–based VHSICs", Canadian Conference on Electrical and Computer Engineering, 1993, vol. 1, pp. 586–589, Sep. 1993.*

(List continued on next page.)

*Primary Examiner*—Matthew Smith
*Assistant Examiner*—Phallaka Kik
(74) *Attorney, Agent, or Firm*—Myers Bigel Sibley & Sajovec (57) ABSTRACT

Methods, apparatus and computer program products are provided that perform the operations of extracting first estimates of the resistance and capacitance of each of a first plurality of nets in an integrated circuit and then determining, for each of the first plurality of nets, a respective maximum delay model that attributes all of the first estimate of the resistance of the respective net to a front-end of the net and all of the first estimate of the capacitance of the respective net to a back-end of the net. Respective minimum delay models are also obtained for each of the first plurality of nets. Each of these minimum delay models attributes all of the first estimate of the resistance of the respective net to the back-end of the net and all of the first estimate of the capacitance of the respective net to a front-end of the net. These minimum and maximum delay models are then used in the determination of minimum and maximum delay estimates for each of the first plurality of nets. The delay estimates are then used to determine a net timing error bound associated with each net. These net timing error bounds are then filtered against a user-specified net timing error tolerance to determine which nets have an excessive timing error bound. Those nets having excessive timing error bounds are then modeled using more accurate models.

3 Claims, 7 Drawing Sheets

U.S. PATENT DOCUMENTS

| | | | |
|---|---|---|---|
| 5,515,291 | * 5/1996 | Omori et al. | 716/6 |
| 5,548,524 | 8/1996 | Hernandez et al. | 716/12 |
| 5,550,750 | 8/1996 | Wolff | 716/10 |
| 5,559,718 | 9/1996 | Baisuck et al. | 716/5 |
| 5,568,395 | * 10/1996 | Huang | 716/4 |
| 5,568,396 | 10/1996 | Bamji et al. | 716/3 |
| 5,574,388 | 11/1996 | Barbier et al. | 326/41 |
| 5,581,474 | 12/1996 | Bamji et al. | 716/2 |
| 5,590,049 | 12/1996 | Arora | 716/5 |
| 5,592,392 | 1/1997 | Matheson et al. | 716/11 |
| 5,604,680 | 2/1997 | Bamji et al. | 716/8 |
| 5,606,698 | 2/1997 | Powell | 717/9 |
| 5,610,832 | 3/1997 | Wikle et al. | 716/11 |
| 5,623,419 | 4/1997 | Kundert | 716/5 |
| 5,625,564 | 4/1997 | Rogoyski | 716/1 |
| 5,625,565 | 4/1997 | Van Dyke | 716/1 |
| 5,634,115 | 5/1997 | Fitzpatrick et al. | 716/3 |
| 5,636,132 | 6/1997 | Kamdar | 716/2 |
| 5,648,910 | 7/1997 | Ito | 716/2 |
| 5,649,166 | 7/1997 | Saldanha et al. | 716/2 |
| 5,689,432 | 11/1997 | Blaauw et al. | 716/18 |
| 5,691,910 | 11/1997 | Thodiyil | 702/60 |
| 5,790,415 | * 8/1998 | Pullela et al. | 716/6 |
| 5,963,729 | * 10/1999 | Aji et al. | 716/5 |
| 5,999,726 | * 12/1999 | Ho | 716/11 |
| 6,028,989 | * 2/2000 | Dansky et al. | 716/8 |
| 6,038,383 | * 3/2000 | Young et al. | 716/5 |
| 6,110,219 | * 8/2000 | Jiang | 716/1 |

OTHER PUBLICATIONS

O'Brien et al., "Modeling the driving–point characteristic of resistive interconnect for accurate delay estimation", 1989 IEEE International Conference on Computer–Aided Design, 1989, ICCAD–89, Digest of Technical Papers, pp. 512–515, Nov. 1989.*

IBM TDB–ACC–No: NN9201233, Zero Skew Techniques for VLSI System, IBM Technical Disclosure Bulletin, vol. 34, No. 8, pp. 233–240 (1–12), Jan. 1992.*

Choudhury et al., "Automatic Generation of Analytical Models for Interconnect Capacitances", IEEE Transactions on Computer–Aided Design of Integrated Circuits and Systems, vol. 14, No. 4, Apr. 1995, pp. 470–480.

Arora et al., "Modeling and Extraction of Interconnect Capacitances for Multilayer VLSI Circuits", IEEE Transactions on Computer–Aided Design of Integrated Circuits and Systems, vol. 15, No. 1, Jan. 1996, pp. 58–67.

Chiang et al., "Time–Efficient VLSI Artwork Analysis Algorithms in GOALIE2", IEEE Transactions on Computer–Aided Design, vol. 8, No. 6, Jun. 1989, pp. 640–648.

Belkhale et al., "Parallel Algorithms for VLSI Circuits Extraction", IEEE Transactions on Computer–Aided Design, vol. 10, No. 5, May 1991, pp. 604–618.

Riedell et al., Dielectric Characterization Of Printed Circuit Substrates; Conference Proceedings—IEEE Southeastcon '89, Proceedings, vol. 1 of 3, Apr. 9–12, 1989, Conference and Exhibit, pp. 102–106.

Basel et al., Hierarchical Simulation of High Speed Digital Interconnects Using A Packaging Simulator, 1994 Proceedings, 44$^{th}$ Electronic Components & Technology Conference, May 1–May 4, 1994, IEEE, pp. 81–87.

Basel, Accurate and Efficient Extraction of Interconnect Circuits for Full–Chip Timing Analysis, Wescon Conference Record 1995, Moscone Convention Center, San Francisco California, Nov. 7–9, 1995, pp. 118–123.

Wang et al., Accurate Parasitic Resistance Extraction for Interconnection Analysis, Proceedings of the IEEE 1995 Custom Integrated Circuits Conference, May 1–4, 1995, 12.2.1–12.2.4, pp. 255–258.

Basel et al., Simulation of High Speed Interconnects Using A Convolution–Based Hierarchical Packaging Simulator, IEEE Transactions on Components, Packaging, and Manufacturing Technology, Part B, vol. 18, No. 1, Feb. 1995, pp. 74–82.

Franzon et al., Tools to Aid in Wiring Rule Generation for High Speed Interconnects, Proceedings—Design Automation Conference, 29th ACM/IEEE Design Automation Conference, 1992 IEEE, pp. 466–471, Jun. 1992.

Basel et al., High Speed Digital System Simulation Using Frequency Dependent Transmission Line Network Modeling, IEEE MTT–S International Microwave Symposium Digest, vol. 3, 1991 IEEE, pp. 987–990, Jun. 1991.

Riedell et al., Dielectric Characterization of Printed Circuit Board Substrates, IEEE Transactions on Instrumentation and Measurement, vol. 39, No. 2, Apr. 1990, pp. 437–440.

Huang, "Two–Dimensional Capacitance Calculation in Stratified and/or Arbitrary Dielectric Media", IEEE Transactions on Microwave Theory and techniques, vol. 42, No. 3, Mar. 1994, pp. 501–504.

Nabors et al., "Fast Capacitance Extraction of General Three–Dimensional Structures", IEEE Transactions on Microwave Theory and Techniques, vol. 40, No. 7, Jul. 1992, pp. 1496–1506.

Onozawa et al., "Post Layout Optimization of Power and Timing for ECL LSIs", IEEE, Mar. 1995, pp. 167–172.

Navabi et al., "Modeling Strategy for Post Layout Verification", IEEE, 1990, pp. P5–7.1–P5–7.4, Sep. 1990.

Deschacht et al., "Post–Layout Timing Simulation of CMOS Circuits", IEEE, 1993, pp. 1170–1177, Aug. 1993.

Ramachandran et al., "Combined Topological and Functionality–Based Delay Estimation Using a Layout–Driven Approach for High–Level Applications", IEEE, Dec. 1994, pp. 1450–1460.

Huang et al., "Accurate Modeling of Capacitive, Resistive and Inductive Effects of Interconnect", IEEE, Nov. 1995, pp. 115–117.

van Genderen et al., "*Hierarchical Extraction for 3D Interconnect Capacitances in Large Regular VLSI Structure*", Delft University of Technology, Department of Electrical Engineering, Mekelweg 4, 2628 CD Delft, The Netherlands.

Lipman, "*Submicron EDA to Help Tackle Tough Designs*", EDN, Jun. 8, 1995, pp. 44–51.

Schultz, "*Timing Analysis Tools and Trends*", Focus Report, Integrated System Design, Nov. 1995, pp. 50–57.

Le Coz et al., "*A Stochastic Algorithm for High Speed Capacitance Extraction in Integrated Circuits*", Solid–State Electronics, vol. 35, No. 7, 1992, pp. 1005–1012.

* cited by examiner

METHODS, APPARATUS AND COMPUTER PROGRAM PRODUCTS FOR PERFORMING POST-LAYOUT VERIFICATION OF MICROELECTRONIC CIRCUITS USING BEST AND WORST CASE DELAY MODELS FOR NETS THEREIN

CROSS-REFERENCE TO RELATED APPLICATION

This application is a continuation-in-part (CIP) of U.S. application Ser. No. 08/706,182, filed Aug. 30, 1996, now U.S. Pat. No. 5,896,300, the disclosure of which is hereby incorporated herein by reference.

FIELD OF THE INVENTION

This invention relates to the design, layout, testing and manufacture of microelectronic circuits and systems, and more particularly to apparatus and methods for verifying microelectronic circuits and systems, prior to manufacture.

BACKGROUND OF THE INVENTION

Present day ultra-large-scale integration (ULSI) circuits may include hundreds of thousands or millions of interconnected active electronic devices on an integrated circuit chip. The large capital investment required to fabricate and test large scale integrated circuits prior to sale to a customer and the difficulty, expense and loss of goodwill associated with reworking and replacing integrated circuits which fail to operate as planned, have increased the need to accurately characterize the electrical behavior of integrated circuits prior to their manufacture.

Figure 1A:
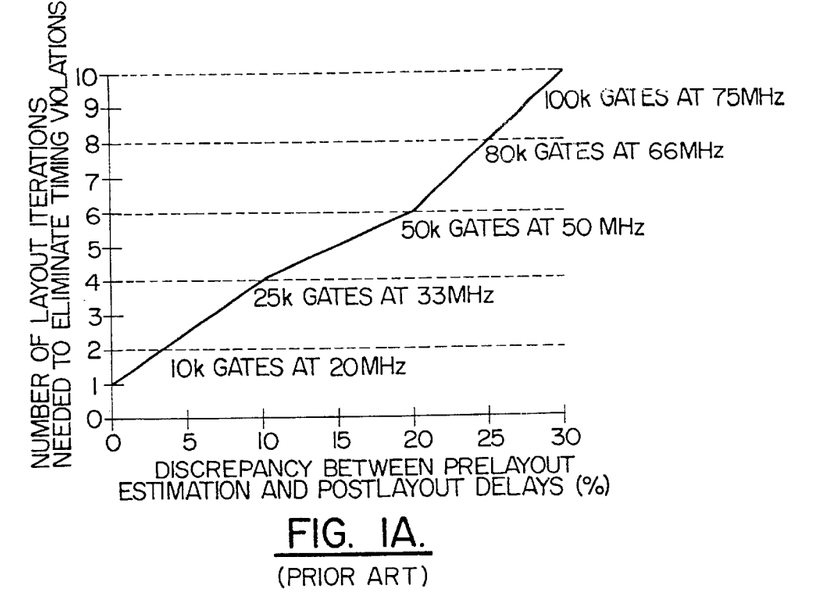
FIG. 1A is a graphical illustration of the number of layout iterations needed to eliminate timing violations versus percentage error between pre-layout delay estimation and post-layout delay calculation.

Moreover, now that submicron and deep-submicron (0.5 $\mu$m and below) technologies have begun to dominate silicon chip manufacturing and the prospect of million-plus-gate chips operating at clock rates of 100 MHz has become a reality, fundamental changes have had to be made to conventional integrated circuit design methodologies and the electronic design automation (EDA) tools based thereon. To meet these challenges, more sophisticated techniques for estimating electronic design parameters such as signal delay and power dissipation are required. In particular, accurate delay estimation now generally requires a stronger link between front-end tools such as chip partitioning and behavioral synthesis and back-end tools such as block placement and layout. Without such a link, deep-submicron designs may have to undergo multiple design iterations to meet specifications. This process can be expensive and time consuming. As illustrated by FIG. 1A, the number of layout iterations needed to eliminate timing violations generally increases significantly as logic density and clock speed increase. FIG. 1A also illustrates that more accurate delay estimation during front-end design generally leads to fewer time-consuming layout iterations. This saves money and shortens the design cycle. The data of FIG. 1A is based on a 0.8 $\mu$m design having less than 30% of the chip die consumed by a large functional block and is a reproduction of FIG. 1 from an article by J. Lipman entitled Submicron EDA to Help Tackle Tough Designs, Electronic Design News, pp. 45–50, Jun. 8, 1995.

Figure 1B:
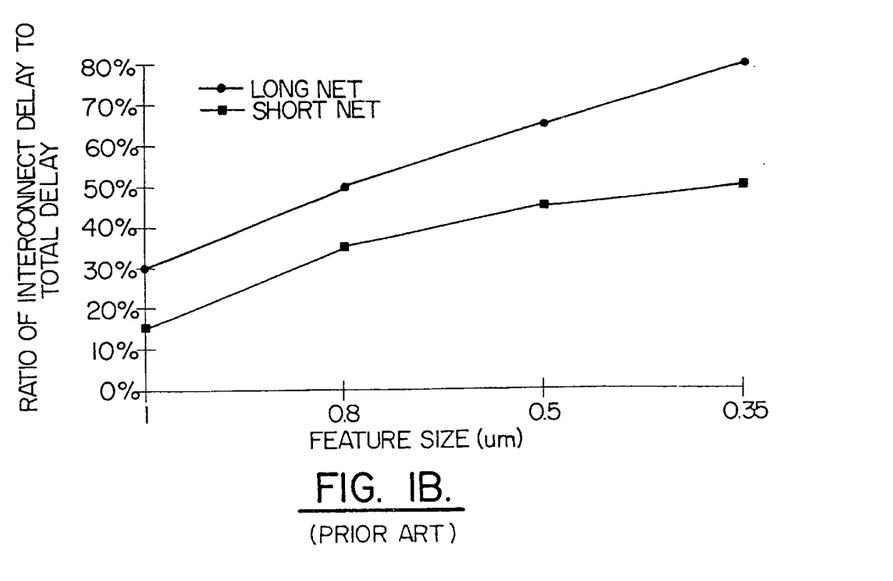
FIG. 1B is a graphical illustration of the ratio of interconnect delay to total delay versus integrated circuit critical feature size.

Unfortunately, as the minimum feature sizes of integrated circuits continue to shrink and operating speeds increase, characterization of the parasitic effects associated with passive nets (e.g., wiring) which interconnect the active devices within the circuit also may become more critical and more difficult. In the past, the effect of interconnect nets could generally be disregarded when simulating the operation of an integrated circuit, because the active devices therein typically dominated the overall circuit delay calculations while the delays associated with interconnect nets were typically considered negligible. However, as the minimum feature sizes of integrated circuits continue to shrink and the improvement in transistor propagation delay has exceeded that due to interconnect, the ratio of interconnect net delay to total delay has increased to greater than fifty percent (50%), as illustrated by FIG. 1B. In particular, as the minimum feature sizes decrease, the resistance and the height/width aspect ratio of the interconnect nets tend to increase and the number of wiring levels also typically tends to increase. The increased height/width aspect ratio and the close proximity of metal wiring lines at multiple levels makes cross-talk capacitance larger between adjacent wiring lines and makes the modeling of capacitance a three-dimensional problem instead of a two-dimensional problem. Now, interconnects generally can no longer be simply modeled as equivalent to a single resistor and capacitor—a lumped equivalent circuit. Instead, EDA tools that predict interconnect delay or extract wiring parasitics for back annotation into the circuit typically use distributed RC equivalent networks to model the interconnects. Accordingly, a complete analysis of the behavior of state-of-the-art integrated circuits typically must account for the resistive and capacitive effects of the interconnect paths in addition to the active devices.

However, because detailed extraction of the resistance and capacitance of the nets is typically required to accurately model total interconnect delay and because complex three-dimensional capacitance models are typically required to extract accurate capacitance values, a complete characterization of the active devices and interconnect nets can become extremely time consuming and may exceed the storage capabilities of the processing system on which the characterization is being performed. Thus, attempts to account for timing delays associated with interconnect nets by performing extraction have typically been limited to only certain sections or blocks of a design and have typically used simplified extraction models to improve runtime.

Figure 2:
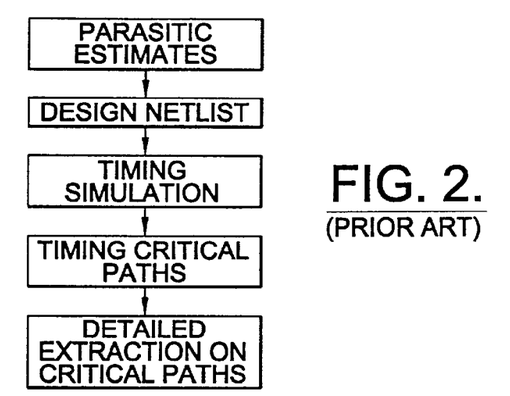
FIG. 2 illustrates operations performed by a post-layout timing verification system according to the prior art.

Attempts have also been made to reduce the complexity of extraction by applying heuristic approaches, such as by selecting only clock nets, "top level" nets, nets with large total capacitance or nets within preselected timing critical paths determined by simplified simulation techniques. For example, traditional attempts to account for the timing delays associated with interconnect nets typically include the steps of performing detailed extraction only after timing critical paths have already been determined. As illustrated best by FIG. 2, such attempts include the steps of supplementing a circuit netlist with unbounded parasitic estimates of the resistance and capacitance of the interconnect nets and then performing a timing simulation of the circuit to identify potential timing critical paths. Detailed parasitic extraction of those nets in the timing critical paths may then be performed to determine an updated estimate of the delay associated with the timing critical paths. Unfortunately, these and related attempts typically rely on relatively inaccurate parasitic estimates based on simplified models which can cause the timing analysis tool to select "false" critical paths and miss "real" critical paths. This means that necessary detailed parasitic extraction may not be performed on some layout critical nets.

Other traditional approaches include the net constraint and path constraint approach. In the net constraint approach, a user specifies fixed net constraint values across a design to guide a layout program. One of the drawbacks of this approach is the difficulty of sharing timing resources among several nets. A timing resource is a portion of an overall delay to be distributed through a physical layout. In addition, this approach may fail to account for the fact that different paths usually share common nets. Thus, a burden is placed on a designer to divide path delays into net delays, before the actual layout of the nets has actually been determined. This approach is also limited by the fact that net delay constraints are generally fixed and typically cannot be altered during layout. In the case where one of the nets in a path takes up a shorter than expected delay, it may be difficult to share this extra timing resource with other nets in the same path in the event their respective net delay constraints are underestimated. Finally, in the path constraint approach, the whole path is constrained to meet a target path delay. But, because the relationships between different timing paths can be complicated, even a slight movement of a cell during layout can significantly affect the delays of many nets. This, in turn, can require a reevaluation of the delays on numerous paths. Due to these drawbacks, designers commonly only constrain a few of what they think will likely be the most timing critical paths which means that real timing critical paths may be missed.

Thus, notwithstanding the above described methods of accounting for timing delays associated with interconnect nets by evaluating only certain blocks of a circuit design, using simplified models and/or applying heuristic approaches, there continues to be a need for improved methods and apparatus for taking into account interconnect delays when simulating microelectronic circuits and evaluating their performance.

SUMMARY OF THE INVENTION

It is therefore an object of the present invention to provide improved methods, apparatus and computer program products for performing post-layout verification of microelectronic integrated circuits.

It is also an object of the present invention to provide methods, apparatus and computer program products for modeling interconnect cell and path delays in microelectronic integrated circuits.

It is another object of the present invention to provide methods, apparatus and computer program products for performing detailed parasitic extraction of interconnect nets in microelectronic integrated circuits.

It is a further object of the present invention to provide methods, apparatus and computer program products for performing post-layout verification of high speed microelectronic circuits by identifying layout critical nets and timing critical paths therein.

These and other objects, features and advantages are provided, according to the present invention, by methods, apparatus and computer program products for performing post-layout verification of microelectronic integrated circuits by extracting layout critical nets and determining timing critical paths therefrom. In general, the present invention includes an apparatus containing means for performing bounded parasitic extraction of typically all nets in an integrated circuit, by initially performing a resistance-only extraction and/or capacitance-only extraction using computationally inexpensive electrical models of the nets. In one preferred embodiment of the present invention, the resistance and capacitance extractions are combined to generate realistic worst case and best case delay models for each of the extracted nets. For example, the delay models may be based on the resistance-only extraction and an upper bound on the parasitic capacitance of the net determined from the capacitance-only extraction. However, other models based solely on a resistance-only extraction may also be used, although they are typically less preferred. A user-specified timing error tolerance is then used to automatically determine the appropriate level of additional extraction detail to be applied to each portion of the integrated circuit. For example, the user-specified timing error tolerance can be used to determine which nets need a more accurate distributed RC extraction. This gives the user direct error control over the extraction process so that the extracted netlist meets the user-specified timing error tolerance.

In particular, the present invention preferably includes an apparatus for extracting nets in a high speed microelectronic integrated circuit. This apparatus contains means for modeling a first plurality of nets in the circuit to obtain first estimates of the resistance and capacitance of the nets using first electrical models thereof. The apparatus also includes means for determining for each of the first plurality of nets, a first net timing error bound associated with an electrical signal traversing the respective net. The first net timing error bounds are preferably determined from the first estimates of the resistance and capacitance of the nets. For example, the estimates can be used to determine a minimum delay model ($T_{min}$) and a maximum delay model ($T_{max}$), where the relative timing error bound (RTB) for each net equals $|(T_{max}-T_{min})/T_{min}|$.

Means is also provided for filtering the first net timing error bounds against a user-specified first net timing error tolerance (e.g., 10%), to determine at least one net which has a corresponding timing error bound greater than or equal to the timing error tolerance. This at least one net is then modeled with a more computationally expensive and accurate model to determine an updated estimate of the resistance and capacitance of the at least one net. For example, in the event the apparatus is capable of utilizing models having only two levels of accuracy, the at least one net can typically be modeled by performing a more detailed distributed RC extraction, instead of another resistance-only and capacitance-only extraction.

However, the apparatus preferably has the capability of utilizing models having more than two levels of accuracy so that multiple filtering steps can be performed iteratively to efficiently select only a relatively few nets requiring the most detailed and computationally expensive level of parasitic extraction. Thus, the preferred apparatus also contains means for filtering the first net timing error bounds for the first plurality of nets against the user-specified first net timing error tolerance, to determine a second plurality of nets which each have a first net timing error bound greater than or equal to the first net timing error tolerance. Here, means is also provided for modeling the second plurality of nets to obtain second estimates of the resistance and capacitance of the second plurality of nets using second electrical models thereof which are different from the respective first electrical models thereof. In addition, means is provided for determining, for each of the modeled second plurality of nets, a second net timing error bound associated with an electrical signal traversing the respective net, based on the second estimates of the resistance and capacitance of the nets.

These second net timing error bounds are then filtered against a second net timing error tolerance, to determine at least one net from the second plurality of nets which has a second net timing error bound greater than or equal to the second net timing error tolerance. This at least one net is then modeled again using a more accurate electrical model thereof which is different from the respective first and second electrical models thereof. Here, a highly accurate electrical model may constitute a distributed RC network model. As will be understood by those skilled in the art, because more accurate models are typically used on the second plurality of nets, the second net timing error bounds will typically be significantly less than the corresponding first net timing error bounds for the same net. Accordingly, if the first and second net timing error tolerances are the same for each iteration, the filtering means will select fewer and fewer nets for more detailed extraction during each iteration.

The present invention also includes methods, apparatus and computer program products for identifying timing critical paths in an integrated circuit containing a plurality of nets and active devices which collectively define a plurality of paths therein. In particular, a preferred method includes performing detailed parasitic extraction by first modeling each of a first plurality of nets in the circuit to obtain first estimates of the resistance and capacitance of the nets and then determining therefrom, for each of the nets, a first net timing error bound associated with an electrical signal traversing the respective net. For example, the net timing error bound may constitute a timing error bound (RTB) as an upper limit on the timing error between a minimum delay model ($T_{min}$) and a maximum delay model ($T_{max}$). The timing error bounds are then filtered at least once against a user-selected timing error tolerance to determine which of the nets have a respective timing error bound at or in excess of the user-selected timing error tolerance. The selected nets having excessive timing error bounds are then modeled again, preferably with more (or the most) accurate models to determine a smaller respective timing error bound for each of the selected nets or a single estimate of delay in the event the most accurate delay models available (e.g., distributed RC network models) are used. The modeling and filtering steps can then be repeatedly performed in an iterative manner until the user-selected timing error tolerance has been satisfied for all nets.

Once the steps of performing detailed parasitic extraction have been completed so that all nets can be guaranteed to have a net timing error bound within the user-selected tolerance, timing analysis is performed on the paths of the integrated circuit using the bounded or single estimate delay information obtained from the extracted nets. As will be understood by those skilled in the art, the timing analysis is typically performed at a high level by summing the maximum delay estimates for the nets contained in a respective path. Based on these analyses, a set of potential timing critical paths are identified in a conventional manner. For example, a determination can be made as to which of the plurality of paths have a respective path delay within a certain range (e.g., %) of the largest delay associated with any path or in excess of a predetermined path delay.

As will be understood by those skilled in the art, because each of the nets in the identified potential timing critical paths meet the user-selected error tolerances, the error bounds associated with the potential timing critical paths will also meet the user-selected error tolerances. In other words, if the largest relative timing error bound of a net within a path is 8%, the delay associated with the path (i.e., the sum of the maximum net delays) will also be within 8% of its true value, where the true value equals the summation of all the delays of the nets in the path assuming all nets are modeled using the most accurate delay models (e.g., distributed RC network models). However, because many of the nets in the paths typically do not require the most detailed level of parasitic extraction to meet the user-selected error tolerances, substantial computational expenses are saved. Yet, for those nets which are more layout critical, the method according to the present invention automatically selects the appropriate level of extraction needed.

According to another aspect of the present invention, the step of determining which of the paths constitute potential timing critical paths is followed by the step of filtering the net timing error bounds for those of the first plurality of nets within one or more potential timing critical paths. Here the first net timing error bounds are filtered against a new net timing error tolerance (e.g., 2%) which is less than the original net timing error tolerance (e.g., 10%). This new net timing error tolerance is referred to herein as a "path" timing error tolerance to indicate that the step of filtering the net timing error bounds is preferably being performed with respect to only those nets within paths identified as potential timing critical paths. This filtering step is used to determine a third plurality of nets which each have a net timing error bound greater than the path timing error tolerance. These third plurality of nets are then modeled again with more or the most accurate models.

In particular, in the event the most accurate models are used, a third net delay is determined for each of the third plurality of nets. However, in the event other models are used which result in the determination of smaller net timing error bounds, a filtering step will again need to be performed against the path timing error tolerance (e.g., 2%). More accurate path delays for the potential timing critical paths can then be determined based on the third net delays (for those nets in the third plurality), the second net delays (for those nets in the second plurality) and the first net delays (for the remaining nets which are not in either the second or third plurality). The potential timing critical paths can then be reevaluated based on the updated path delays to determine which nets actually constitute timing critical paths, based on the smaller path timing error tolerance (e.g., 2%). Thus, rather than wasting computational expense by initially extracting all nets at unnecessarily high levels of accuracy to achieve timing error bounds within the user-selected path timing error tolerance, which is typically substantially less than the user-selected net timing error tolerance, potential timing critical paths are first identified to limit the number of nets therein which may need further extraction using more (or the most) accurate models available.

The methods, apparatus and computer program products of the present invention therefore utilize full chip "smart" extraction, whereby user-specified timing error tolerances are used to automatically determine the appropriate level of extraction detail to be applied to each net of a circuit layout. In addition, computational expense is further reduced by limiting the most detailed levels of extraction to only those nets capable of influencing whether a path constitutes a timing critical path.

According to a further aspect of the present invention, methods are provided which include the steps of extracting first estimates of the resistance and capacitance of each of a first plurality of nets in an integrated circuit and then determining, for each of the first plurality of nets, a respective maximum delay model that attributes all of the first estimate of the resistance of the respective net to a front-end of the net and all of the first estimate of the capacitance of the respective net to a back-end of the net. Respective minimum delay models are also obtained for each of the first plurality of nets. Each of these minimum delay models attributes all of the first estimate of the resistance of the respective net to the back-end of the net and all of the first estimate of the capacitance of the respective net to a front-end of the net. These minimum and maximum delay models are then used in the determination of minimum and maximum delay estimates for each of the first plurality of nets. The delay estimates are then used to determine a net timing error bound associated with each net. These net timing error bounds are then filtered against a user-specified net timing error tolerance to determine which nets have an excessive timing error bound. Those nets having excessive timing error bounds are then modeled using more accurate models.

Methods of extracting nets interconnecting active devices in an integrated circuit may also include the steps of extracting a "worst case" distributed RC network for each of a first plurality of nets in the integrated circuit using an upper limit of a bounded capacitance model of the respective net and extracting a "best case" distributed RC network for each of the first plurality of nets using a lower limit of the bounded capacitance model of the respective net. Each bounded capacitance model for a respective net is affected by the wires forming the net itself as well as the wires that are in proximity to it, and is obtained by assuming best and worst case conditions about wires (within other nets) that are greater than a specified distance from a respective net. These operations of assuming worst and best case conditions associated with each net is much more computationally efficient than attempting to obtain a highly accurate estimate of the exact capacitance of a respective net. A net timing error bound is then determined for each of the nets, based on the worst and best case distributed RC networks for the net. The net timing error bounds are then filtered against a user-specified net timing error tolerance to determine which of the nets require more accurate modeling.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 3:
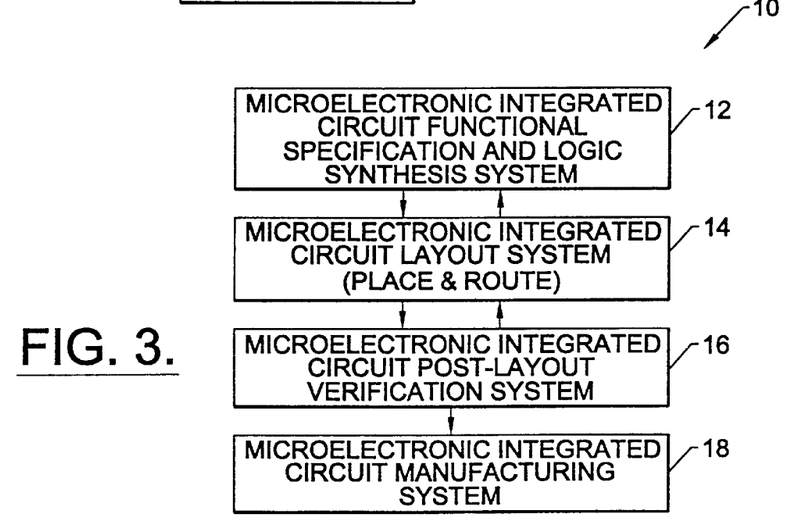
FIG. 3 illustrates a functional block diagram of microelectronic integrated circuit synthesis, layout and manufacturing methods, systems and computer program products according to the present invention.

Referring now to FIG. 3, the operations performed by a computer aided microelectronic integrated circuit synthesis, layout and manufacturing system 10 will be generally described. The system includes four general subsystems: an integrated circuit functional specification and logic synthesis system 12, an integrated circuit layout system 14, an integrated circuit verification system 16 and an integrated circuit manufacturing system 18. The microelectronic integrated circuit functional specification and logic synthesis system 12 may include circuit libraries or macros for such elements as logic gates, flip-flops, registers, memory elements, drivers and buffers, for example. The functional specification and logic synthesis system 12 typically provides a vehicle for generating and displaying an electrical schematic of an integrated circuit and producing a computer readable representation of the schematic as a design netlist. As described more fully herein, the electrical schematic of the integrated circuit may contain a plurality of timing paths collectively defined by a plurality of nets and active devices connected thereto. The microelectronic integrated circuit layout system 14 also typically provides a vehicle for generating a physical layout by placing and routing an electrical circuit schematic generated by the functional specification and logic synthesis system 12. A wiring program may also be provided with the layout system 14 for automatically determining the placement of the wiring interconnect nets between the active device elements of the microelectronic integrated circuit.

A verification system 16 is also preferably provided for performing an independent verification of the physical layout to ensure compliance with the requirements of the functional specification and logic synthesis system 12 as well as the manufacturing system 18. Accordingly, the verification system 16 is typically referred to as a "post-layout" verification system and is typically employed near the end of the design process. In addition to acting as an independent verification of the operability and correctness of the layout of the circuit design, the verification system 16 may provide means by which changes and optimizations can be performed. As will be understood by those skilled in the art, various other types of analyses such as timing analysis and circuit/logic simulation may be performed to check whether the specifications and requirements of the first two subsystems 12 and 14 are satisfied. After verification, the physical layout. is forwarded to the manufacturing system 18 to produce the integrated circuit. The microelectronic circuit manufacturing system 18 may generate the required masks, and may control the manufacturing tools necessary to fabricate the integrated circuit on a semiconductor wafer, for example.

It will be understood by those having skill in the art that the integrated circuit functional specification and logic synthesis system 12, microelectronic circuit layout system 14 and various parts of the microelectronic integrated circuit manufacturing system 18 may be realized in whole or in part as software modules running on a computer system. Alternatively, a dedicated stand-alone system with application specific integrated circuits for performing the above described functions may be provided. The general design and operation of the functional specification and logic synthesis system 12, layout system 14 and manufacturing system 18 are well known to those having a skill in the art and need not be described further herein.

Figure 4:
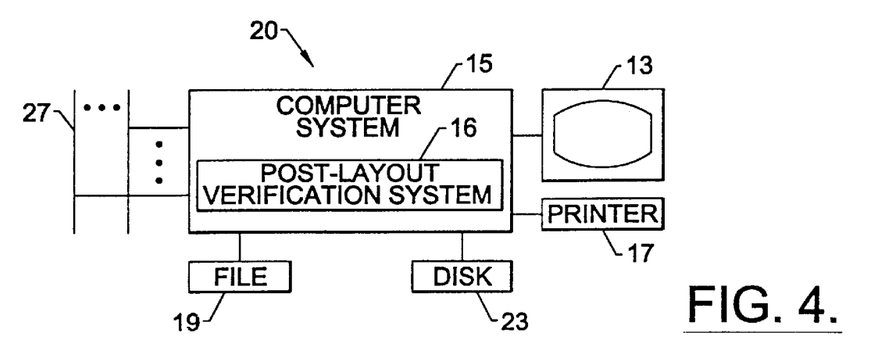
FIG. 4 illustrates a general hardware description of integrated circuit post-layout verification systems, methods and computer program products according to the present invention.

Referring now to FIG. 4, a general hardware description of a computer workstation containing, among other things, the integrated circuit post-layout verification system 16 of FIG. 3 will be described. As shown by FIG. 4, the workstation 20 preferably includes a computer 15 containing a hierarchical post-layout verification software sub-system 16 running thereon. The post-layout verification system 16 may accept a computer representation of the electrical schematic and layout of an integrated circuit via a file 19, disk input 23 or data bus 27. A display 13 and printer 17 are also preferably provided to assist in verifying the layout and design of the integrated circuit. The hardware design of the above described components 13, 17, 19, 27 and 23 is well known to those having skill in the art and need not be described further herein. As one example, the post-layout verification system 16 may be run on a computer system such as a UNIX-based workstation.

Figure 5:
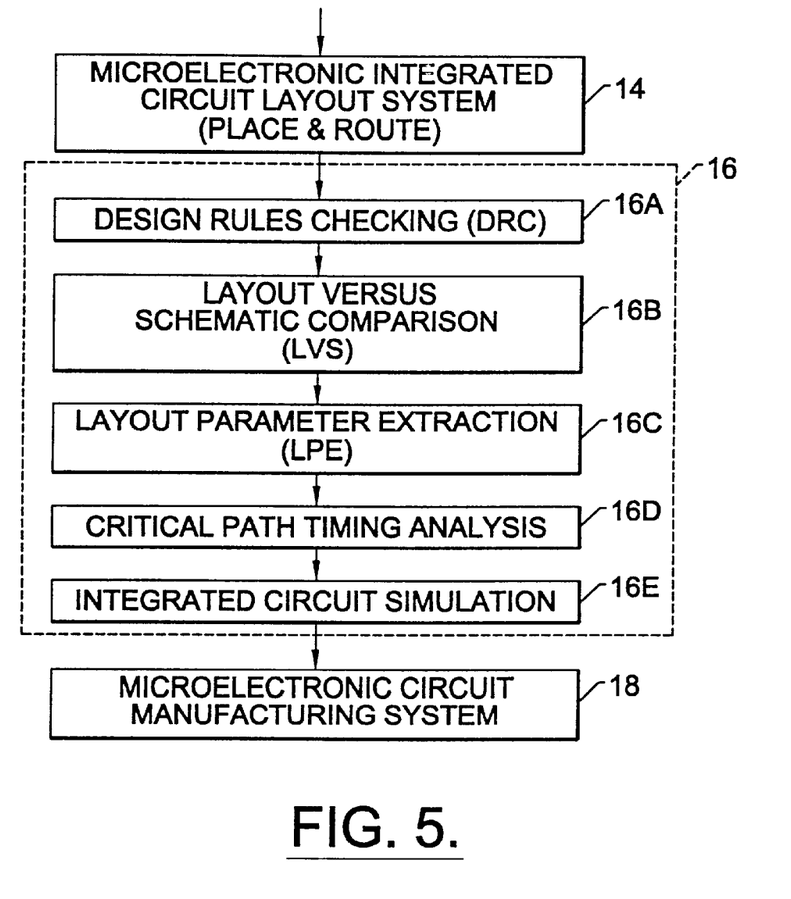
FIG. 5 illustrates operations performed by the post-layout timing verification systems, methods and computer program products according to the present invention.

Referring now to FIG. 5, there is illustrated a general overview of the operations performed by the post-layout verification system 16 of the present invention. In particular, the post-layout verification system 16 is illustrated as performing five (5) operations 16A–16E. For sake of clarity, these operations are illustrated and described as discrete operations, however, combinations of these operations may be performed simultaneously. The first operation 16A is performed by a design rules checking (DRC) tool which runs comprehensive hierarchical design rule checks on a geometric database containing the physical layout of an integrated circuit to be verified. The operations performed by the design rules checking tool include, among other things, checking for area, grid, length, size, spacing, corner, enclosure, intersection and overlap errors, for example. The second operation 16B is performed by a hierarchical layout versus schematic (LVS) tool which extracts a hierarchical netlist from the geometric layout database and compares it to the electrical schematic netlist. Layout and schematic logic agreement is then verified at hierarchical matching points. These first and second operations of the verification system 16 are more fully described in a reference manual which is commercially available from the assignee of the present application, Avant! Corporation of Freemont, Calif., under the trademark VeriCheck® 2.5.1, October (1995), the disclosure of which is hereby incorporated herein by reference.

The third and fourth operations 16C and 16D are performed by a layout parameter extraction (LPE) tool and a critical path timing analysis tool. In particular, these tools, which are described more fully hereinbelow, perform the functions of extracting layout critical nets preferably by performing a multi-tiered layout parameter extraction of typically all interconnect nets in the geometric layout database and determining delay bounds for those nets. Here, a user-specified timing error tolerance is provided to automatically determine, through delay bound filtering, the appropriate level of extraction detail to be applied to each portion of the physical layout of an integrated circuit. Once this layout parameter extraction operation 16C is complete, an operation is performed to determine which paths in the integrated circuit constitute timing critical paths. This operation requires the extracted net information obtained from the parameter extraction operation 16C. As illustrated by the reverse upward sequence of arrows in FIG. 3, the determination of timing critical paths and the path delays associated therewith may necessitate redesign of the integrated circuit by the functional specification and logic synthesis system 12 and/or modifying the physical layout using the layout system 14. Finally, in the event the integrated circuit is verified for design rules compliance and the layout versus schematic comparison, extraction and critical path determinations yield acceptable results, the physical layout is forwarded to the manufacturing system 18 to produce the integrated circuit.

The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code means embodied in the medium. Any suitable computer-readable medium may be utilized including hard disks, CD-ROMs or other optical or magnetic storage devices.

Figure 6:
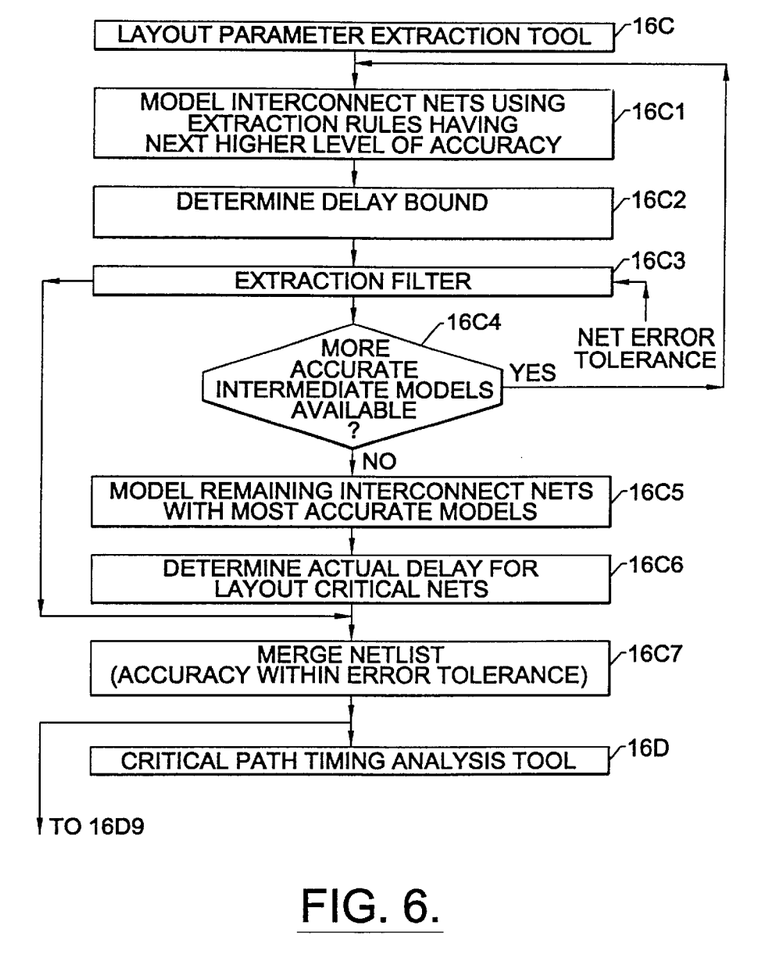
FIG. 6 illustrates operations performed by the layout parameter extraction tool according to the present invention.

Referring now to FIG. 6, the operations performed by the layout parameter extraction tool 16C of FIG. 5 will be more fully described. As illustrated, the extraction tool 16C performs an initial operation of modeling each of a first plurality of interconnect nets in an integrated circuit layout to obtain first estimates of the parasitic resistance and capacitance of the nets using first electrical models thereof, Block 16C1. Preferably, the electrical models are initially derived from the least computationally expensive extraction rules. As illustrated by FIG. 5, the integrated circuit layout is provided as a physical schematic by the integrated circuit layout system 14. As described above, the layout system 14 provides a vehicle for generating a physical layout by placing and routing an electrical circuit schematic generated by the functional specification and logic synthesis system 12.

The initial modeling operation to generate estimates of the parasitic resistance and capacitance of the interconnect nets, Block 16C1, may be performed by using a geometric extraction engine for extracting the parasitic capacitance and resistance of the nets using geometric extraction rules or models. An exemplary extraction engine is more fully described in the aforementioned VeriCheck® instruction manual. In addition, an example of a preferred tool for generating geometric extraction rules and providing an interface to an extraction engine is a commercially available software product from the assignee of the present application, Avant! Corporation of Freemont, Calif. This software product, which is marketed under the tradename TCAD Interface™, is more fully described in an user instruction manual by the same name, Release 2.5.1., April (1996), the disclosure of which is hereby incorporated herein by reference. The TCAD Interface™ software performs a number of operations, including deep submicron process characterization and runset generation. The interface requires a 3-dimensional simulation tool for process characterization. This tool is called by the TCAD Interface™ software to perform the necessary simulations required for generating multiple sets of extraction rules corresponding to different levels of extraction accuracy.

The TCAD Interface™ software currently employs a 3-dimensional simulation tool which is commercially available from Technology Modeling Associates, Inc. of Sunnyvale, Calif., under the tradename Raphael™. The 3-dimensional simulation tool characterizes the process by building special structures based on user-defined process parameters and performing 3-dimensional extractions on the special structures. These structures are designed to emphasize specific kinds of capacitive interactions, overlap, cross-coupling, etc. These interactions may have significant 3-dimensional components, particularly as the aspect ratios of the metal interconnect wiring in deep submicron processes increases. For example, according to the TCAD Interface™ software, a user specifies electrical and physical process information in a process file and then that data is combined with a list of relevant layer interactions stored in an extraction definition file. The TCAD Interface™ software analyzes the results of the 3-dimensional extraction and maps them to a 2-dimensional extraction environment. The results of these operations are then stored in a regression database file for use in generating the actual extraction runsets. The entire characterization process can take several days to complete, but generally needs to be performed only once per fabrication process.

Referring still to FIG. 6, the initial modeling operation, Block 16C1, is followed by an operation of determining for each of the nets, an initial net timing error bound associated with an electrical signal traversing the respective net, Block 16C2. These initial net timing error bounds are preferably determined from the respective estimates of the resistance and capacitance of the nets. According to one embodiment of the present invention, the estimates can be used to determine a minimum delay model ($T_{min}$) and a maximum delay model ($T_{max}$), where the relative timing error bound (RTB) for each net equals $|(T_{max}-T_{min})/T_{min}|$. In the event a particular net is modeled as a single lump-sum resistor and capacitor, a maximum delay model ($T_{max}$) is preferably calculated based on an assumption that all of the lump-sum capacitance occurs at the end of the net, at the input to an active device, and a minimum delay model ($T_{min}$) is preferably calculated based on an assumption that all of the capacitance occurs at the beginning of the net, at the output of an active device. In other words, the minimum and maximum delay models represent the extreme cases for modeling delays and the relative bound determined therefrom represents the maximum possible error in delay in the event more accurate and computationally expensive models of the net are not used.

Figure 8:
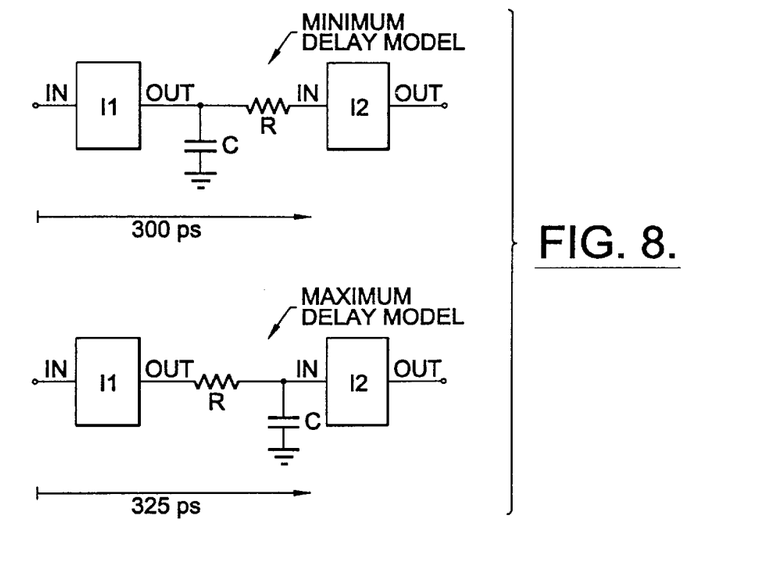
FIG. 8 illustrates minimum and maximum delay models for a hypothetical interconnect net.

The minimum and maximum delay models for each net are also preferably determined by including the contribution(s) of the active device(s) which drive(s) the net, using conventional delay models, however, other techniques for estimating total net delay may also be used as will be understood by those skilled in the art. For example, as illustrated by FIG. 8, the minimum delay model ($T_{min}$) associated with a hypothetical net connected between first and second active devices I1 and I2 may approximate the net as a single lump-sum resistor and capacitor with all the capacitance at the front-end of the net, at the output of the first active device I1. Based on this assumption, the minimum delay model (e.g., 300 ps) may be determined as an estimate of the delay from the input of the first active device I1 to the input of the second active device I2. Alternatively, the maximum delay model ($T_{max}$) associated with a net connected between the first and second active devices I1 and I2 may approximate the net as a single lump-sum resistor and capacitor with all the capacitance at the back-end of the net, at the input of the second active device I2. Based on this assumption, the maximum delay model (e.g., 325 ps) may be determined as an estimate of the delay from the input of the first active device I1 to the input of the second active device I2. A relative timing error bound (RTB=(325−300)/300) of 8.3% may then be determined. Here, the actual delay associated with any net will be guaranteed to be within the range determined by the respective bound (i.e., $T_{min} \leq T_{actual} \leq T_{max}$). This feature of the present invention takes advantage of the fact that it is typically substantially less computationally expensive to find an upper/lower bound extraction result than it is to find an exact answer (i.e., actual delay).

Once an initial timing error bound has been determined for each of the nets, Block 16C2, an operation is performed to filter the first net timing error bounds against a user-specified net timing error tolerance (ET), Block 16C3. This operation is performed to determine at least one net which has a corresponding timing error bound greater than or equal to the user-selected net timing error tolerance (e.g., 10%). Stated alternatively, this operation is performed to identify those nets which need more accurate and computationally expensive modeling to achieve a narrower timing error bound (e.g., smaller relative timing error bound which can be expressed as a percentage) which is within the user-selected net timing error tolerance. Alternatively, bounds other than time-based bounds may also be established based on estimated values of the resistance of the nets, instead of delay models, however use of such bounds is less preferred. Here, the estimates of the resistance of the nets may be filtered against a predetermined threshold resistance to determine which nets have an estimated resistance which is greater than the corresponding threshold. More accurate modeling can then be performed for those nets which have an excessive resistance.

Following the filtering operation, Block 16C3, an operation is performed to model the nets having excessive timing error bounds with more computationally expensive and accurate models derived from more sophisticated and rigorous extraction rules, Blocks 16C1 and/or 16C5. From these models, updated estimates of the resistance and capacitance of the nets can be obtained. In particular, as illustrated by the decision Block 16C4, the extraction tool 16C preferably has the capability of utilizing models having more than two levels of accuracy (e.g., low, intermediate and high level of accuracy models) so that multiple filtering steps can be performed iteratively to efficiently select only a relatively few nets requiring the most detailed and computationally expensive level of parasitic extraction. Thus, the preferred extraction tool 16C performs the operations of filtering the first net timing error bounds for the first plurality of nets against the user-specified first net timing error tolerance, to determine a second plurality of nets which each have a first net timing error bound greater than or equal to the first net timing error tolerance, Block 16C3. Then, an operation is performed to determine whether more accurate intermediate models are available, Block 16C4, and if so, model the second plurality of nets with the next level of models (i.e., intermediate models), to obtain second estimates of the resistance and capacitance of the second plurality of nets, Block 16C1.

An operation is then performed to determine second net timing error bounds for the nets in the second plurality, based on the second estimates of the resistance and capacitance of the nets, Block 16C2. As will be understood by those skilled in the art, because more accurate models are used on the second plurality of nets, the second net timing error bounds will typically be significantly less than the corresponding first net timing error bounds initially determined for the respective net. These second net timing error bounds are then filtered against the net timing error tolerance, to determine at least one net from the second plurality of nets which has a second net timing error bound greater than or equal to the net timing error tolerance. This at least one net is then modeled again using the next more accurate electrical models thereof. Here, the next more accurate electrical models of the at least one net may constitute intermediate models having the next higher level of accuracy, Block 16C1, or the most accurate models which are preferably distributed RC network models, Blocks 16C4–16C5.

However, in the event the most accurate models are used for the nets requiring more accurate extraction, actual delays ($T_{actual}$) will be determined for these nets instead of absolute or relative delay bounds (i.e., (i.e., $|T_{max}-T_{min}|$, $|(T_{max}-T_{min})/T_{min}|$), Block 16C6. For those nets which are modeled to determine actual delay, no further extraction is necessary. Referring still to FIG. 6, the operations of the layout parameter extraction tool are completed by forming a merged netlist of the extracted physical layout, Block 16C7. The merged netlist contains those nets selected by the filter as having delay bounds within the error tolerance and the other remaining nets for which single delay estimates ("actual delays") were determined, Blocks 16C3 and 16C6. Accordingly, the accuracy of the merged netlist is guaranteed to be within the user-selected net timing error tolerance (e.g., 10%).

Figure 7:
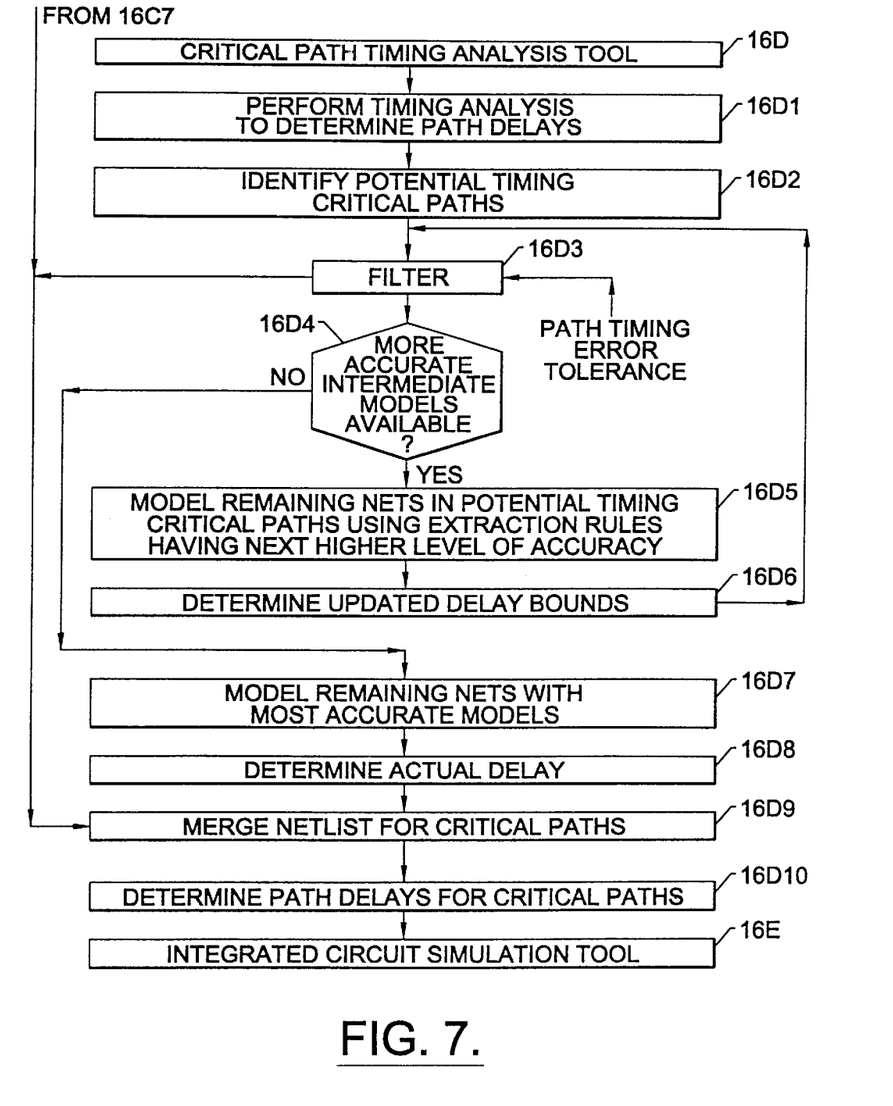
FIG. 7 illustrates operations performed by the critical path timing analysis tool according to the present invention.

Referring now to FIG. 7, the operations performed by the critical path timing analysis tool 16D to identify timing critical paths will be more fully described. These operations are performed in conjunction with the operations performed by the layout extraction parameter tool 16C. In particular, the operations performed by the critical path timing analysis tool 16D rely on the previously extracted physical layout and the merged netlist generated by the layout extraction parameter tool 16C. For example, once the operations for performing detailed parasitic extraction have been completed so that all nets can be guaranteed to have a net timing error bound within the user-selected net timing error tolerance, a timing analysis operation is performed on the paths of the integrated circuit using the bounded or single estimate delay ("actual delay") information obtained from the extracted nets. The timing analysis may be performed at a high level by simply summing the maximum delay estimates ($T_{max}$) or actual delay ($T_{actual}$) for each of the nets (and active devices driving the nets) contained in a respective path, to determine path delays for each of the paths, Block 16D1. Based on the timing analysis, a set of potential timing critical paths can be identified by determining which of the plurality of paths have a respective path delay in excess of a predetermined path delay, Block 16D2. The predetermined path delay may be a user-selected path delay. Alternatively, the potential timing critical paths may be generated by determining which paths have a respective path delay within a certain range (e.g., 10%) of the largest delay associated with any path.

As will be understood by those skilled in the art, because each of the nets in the identified potential timing critical paths meet the user-selected net timing error tolerances, the relative error bounds associated with each of the potential timing critical paths will also meet the user-selected error tolerances. In other words, if the largest relative timing error bound of a net within a path is 8%, the delay associated with the path (i.e., the sum of the maximum net delays will also be within 8% of its true value, where the true value equals the summation of all the delays of the nets in the path assuming all nets are modeled using the most accurate delay models (e.g., distributed RC network models). However, because many of the nets in the paths typically do not require the most detailed level of parasitic extraction to meet the user-selected error tolerances, substantial computational expenses can be saved. Yet, all the nets which are "layout critical" can be accurately modeled with the appropriate level of extraction.

Referring still to FIG. 7, after the potential timing critical paths have been determined, Block 16D2, the critical path timing analysis tool 16D performs the operation of filtering the net timing error bounds for those nets within one or more of the potential timing critical paths, Block 16D3. Here the final net timing error bounds determined by the layout parameter extraction tool 16C and provided in the merged netlist, Block 16C7, are filtered against a path timing error tolerance (e.g., 2%) which is less than the net timing error tolerance (e.g., 10%). This filtering operation is used to determine which of the relatively limited number of nets in the potential timing critical paths require more detailed extraction. Thus, the nets requiring more detailed extraction will be those nets having a net timing error bound greater than the path timing error tolerance. However, for those nets which have already undergone the most detailed level of extraction and for which an actual delay has been determined, Block 16C6, the filtering operation, Block 16D3, will not be applicable.

Once the filtering operation has been performed and those nets which require more detailed extraction have been identified, Block 16D3, a check is performed to determine whether any more accurate intermediate extraction rules and models are available, Block 16D4. If so, the remaining nets requiring more accurate and computationally expensive extraction are modeled to obtain updated estimates the resistance and capacitance of the respective nets, Block 16D5. As described more fully hereinabove with respect to FIG. 6, delay bounds are then determined based on the updated estimates, Block 16D6, and then another filtering operation is performed to iteratively select those nets requiring even more detailed extraction, Block 16D3. Alternatively, in the event no more accurate intermediate models are available after the filtering operation, Block 16D3, the remaining nets are modeled using the most accurate extraction rules to determine an actual delay associated with each of the remaining nets, Blocks 16D7 and 16D8.

The operations of the critical path timing analysis tool 16D are then completed by forming a merged netlist of the extracted physical layout, including the potential timing critical paths, Block 16D9. The merged netlist contains: (i) those nets having delay bounds within the net error tolerance (e.g., 10%), but which are not within any of the potential timing critical paths; (2) those nets within the potential timing critical paths which have delay bounds within the path timing error tolerance (e.g., 2%); and (3) all other extracted nets for which single delay estimates ("actual delays") have been determined. The operations for determining potential timing critical paths are then repeated to determine which paths actually constitute timing critical paths now that one or more of the nets contained therein have undergone more accurate parasitic extraction to meet the path timing error tolerance, Block 16D10. In otherwords, the potential timing critical paths are preferably reevaluated based on the updated path delays to determine which nets actually constitute timing critical paths, based on the smaller path timing error tolerance (e.g., 2%). Thus, rather than wasting computational expense by initially extracting all nets at unnecessarily high levels of accuracy to achieve timing error bounds within the user-selected path timing error tolerance, which is typically substantially less than the user-selected net timing error tolerance, potential timing critical paths are first identified to limit the number of nets therein which may need further extraction using more (or the most) accurate models available.

Accordingly, the present invention utilizes full chip "smart" extraction, whereby user-specified timing error tolerances are used to automatically determine the appropriate level of extraction detail to be applied to each portion of a circuit layout. In addition, computational expense is further reduced by limiting the most detailed levels of extraction to only those nets capable of influencing whether a path constitutes a timing critical path.

Referring again to FIGS. 4–5 and 8, a preferred layout parameter extraction tool may also perform the operations of extracting first estimates of the resistance and capacitance of each of a first plurality of nets in an integrated circuit and then determining, for each of the first plurality of nets, a respective maximum delay model that attributes all of the first estimate of the resistance of the respective net to a front-end of the net and all of the first estimate of the capacitance of the respective net to a back-end of the net. Respective minimum delay models are also obtained for each of the first plurality of nets. Each of these minimum delay models attributes all of the first estimate of the resistance of the respective net to the back-end of the net and all of the first estimate of the capacitance of the respective net to a front-end of the net. These minimum and maximum delay models are then used in the determination of minimum and maximum delay estimates for each of the first plurality of nets. The delay estimates are then used to determine a net timing error bound associated with each net. These net timing error bounds are then filtered against a user-specified net timing error tolerance to determine which nets have an excessive timing error bound. Those nets having excessive timing error bounds are then modeled using more accurate models.

Alternatively, the layout parameter extraction tool may perform the operations of extracting a "worst case" distributed RC network for each of a first plurality of nets in the integrated circuit using an upper limit of a bounded capacitance model of the respective net and extracting a "best case" distributed RC network for each of the first plurality of nets using a lower limit of the bounded capacitance model of the respective net. Each bounded capacitance model for a respective net is affected by the wires forming the net itself as well as the wires that are in proximity to it, and is obtained by assuming best and worst case conditions about wires (within other nets) that are greater than a specified distance from a respective net. These operations of assuming worst and best case conditions associated with each net is much more computationally efficient than attempting to obtain a highly accurate estimate of the exact capacitance of a respective net. A net timing error bound is then determined for each of the nets, based on the worst and best case distributed RC networks for the net. The net timing error bounds are then filtered against a user-specified net timing error tolerance to determine which of the nets require more accurate modeling.

Figure 9:
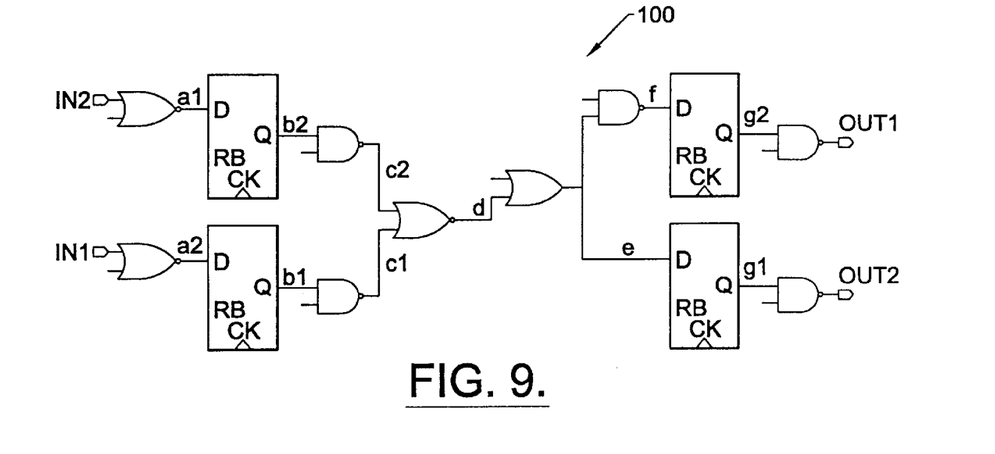
FIG. 9 is an electrical schematic of an exemplary integrated circuit containing standard cells.

Referring now to FIG. 9, one exemplary embodiment of the operations performed by the layout parameter extraction tool 16C of FIG. 5 will be described with reference to a small block of an integrated circuit 100 containing standard cells. The operations are preceded by initial operations of performing a layout versus schematic (LVS) comparison, as illustrated by Block 16B of FIG. 5, and determining all nets in the circuit. Then, once all the nets (A1-2, B1-2, C1-2, D, E, F, G1-2) have been prepared, a resistance-only extraction is performed on all of the nets. The extraction operation includes determining the resistance for all metal layers and contacts associated with the nets, and then creating a parasitic SPICE file therefrom. As will be understood by those skilled in the art, the parasitic resistance data is preferably translated into a standard parasitic format (SPF) file which is subsequently used during the filtering operation. In addition to resistance, capacitance estimates are also determined for every net in the design by performing an initial capacitance-only extraction using computationally inexpensive capacitance models, and generating a parasitic SPICE file therefrom. This parasitic capacitance data is then preferably translated into standard parasitic format as well.

The layout critical nets are then determined using the resistance-only and capacitance-only extractions to bound the maximum timing error that could be incurred for a respective net if a more computationally expensive distributed RC network is not used for that net. For example, the extractions may be used to determine a minimum delay model ($T_{min}$) and a maximum delay model ($T_{max}$) for each net, where the relative timing error bound (RTB) for each net equals $|(T_{max}-T_{min})/T_{min}|$. For purposes of illustration only, Table 1 provides a list of relative timing error bounds (RTB) which could be determined for the nets of FIG. 9.

TABLE 1

| NET | RTB (%) |
|---|---|
| E | 10.1 |
| F | 6.9 |
| C2 | 4.3 |
| G2 | 3.5 |
| C1 | 2.5 |
| D | 2.0 |
| A2 | 1.9 |
| G1 | 1.4 |
| A1 | 1.1 |
| B2 | 0.92 |
| B1 | 0.46 |

Figure 10:
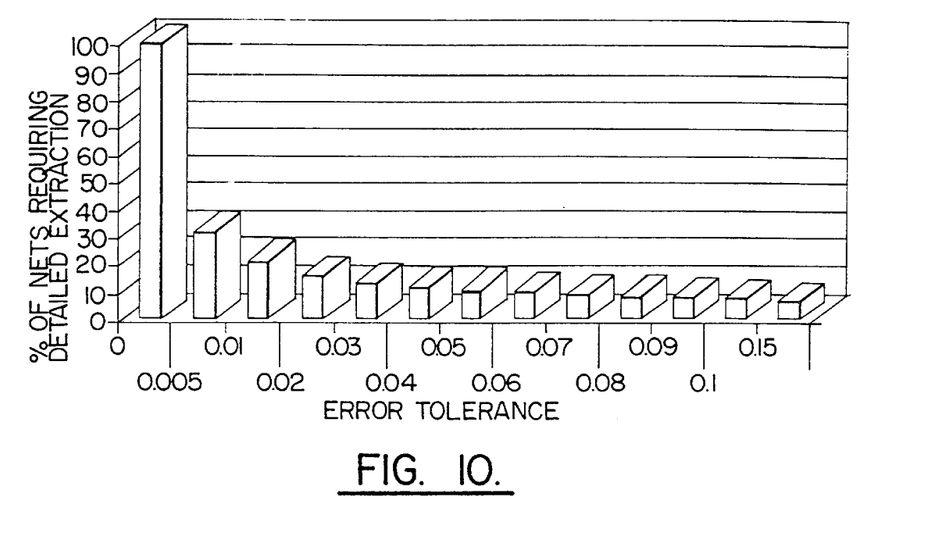
FIG. 10 is a histogram illustrating a relationship between a percentage of interconnect nets requiring the most detailed level of extraction according to the operations of FIG. 6 and the user-selected error tolerance.

From the results of Table 1, maximum errors of 10.1% and 6.9% would be incurred for nets E and F if these nets are not extracted using distributed RC models thereof. Thus, if a user-selected net timing error tolerance of 5% were to be used, nets E and F would be selected for more accurate modeling by the filter (Block 16C3 of FIG. 6). Accordingly, it is unnecessary to extract all nets using the most accurate or detailed level of extraction rules and models based thereon, if the user is willing to accept some timing error in initially determining which nets constitute layout critical nets. This result is best illustrated by FIG. 10 which shows a significant reduction in the number of nets requiring detailed extraction if timing error tolerances are used to filter the extraction operations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of extracting nets interconnecting active devices in an integrated circuit, comprising the steps of:

extracting first estimates of the resistance of each of a first plurality of nets in the integrated circuit;

extracting first estimates of the capacitance of each of the first plurality of nets in the integrated circuit;

determining for each of the first plurality of nets, a respective maximum delay model that attributes all of the first estimate of the resistance of the respective net to a front-end of the net and all of the first estimate of the capacitance of the respective net to a back-end of the net;

determining for each of the first plurality of nets, a respective minimum delay model that attributes all of the first estimate of the resistance of the respective net to the back-end of the net and all of the first estimate of the capacitance of the respective net to a front-end of the net;

determining based on the minimum and maximum delay models of each of the first plurality of nets, a second plurality of nets in the integrated circuit which require more accurate modeling; and modeling each of the second plurality of nets as a respective distributed RC network.

2. A computer program product to extract nets interconnecting active devices in an integrated circuit, comprising a computer readable storage medium having computer-readable program code means embodied in said medium, said computer-readable program code means comprising:

computer-readable program code means for extracting first estimates of the resistance of each of a first plurality of nets in the integrated circuit;

computer-readable program code means for extracting first estimates of the capacitance of each of the first plurality of nets in the integrated circuit;

computer-readable program code means for determining for each of the first plurality of nets, a respective maximum delay model that attributes all of the first estimate of the resistance of the respective net to a front-end of the net and all of the first estimate of the capacitance of the respective net to a back-end of the net;

computer-readable program code means for determining for each of the first plurality of nets, a respective minimum delay model that attributes all of the first estimate of the resistance of the respective net to the back-end of the net and all of the first estimate of the capacitance of the respective net to a front-end of the net;

computer-readable program code means for determining based on the minimum and maximum delay models of each of the first plurality of nets, a second plurality of nets in the integrated circuit which require more accurate modeling; and computer-readable program code means for modeling each of the second plurality of nets as a respective distributed RC network.

3. An apparatus to extract nets interconnecting active devices in an integrated circuit, comprising:

means for extracting first estimates of the resistance of each of a first plurality of nets in the integrated circuit;

means for extracting first estimates of the capacitance of each of the first plurality of nets in the integrated circuit;

means for determining for each of the first plurality of nets, a respective maximum delay model that attributes all of the first estimate of the resistance of the respective net to a front-end of the net and all of the first estimate of the capacitance of the respective net to a back-end of the net;

means for determining for each of the first plurality of nets, a respective minimum delay model that attributes all of the first estimate of the resistance of the respective net to the back-end of the net and all of the first estimate of the capacitance of the respective net to a front-end of the net;

means for determining based on the minimum and maximum delay models of each of the first plurality of nets, a second plurality of nets in the integrated circuit which require more accurate modeling; and means for modeling each of the second plurality of nets as a respective distributed RC network.

* * * * *